(12) United States Patent
Yamamoto

(10) Patent No.: US 6,534,815 B2
(45) Date of Patent: Mar. 18, 2003

(54) SEMICONDUCTOR DEVICE WITH STACK ELECTRODE FORMED USING HSG GROWTH

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/882,253

(22) Filed: Jun. 18, 2001

(65) Prior Publication Data

US 2001/0030336 A1 Oct. 18, 2001

Related U.S. Application Data

(62) Division of application No. 09/392,660, filed on Sep. 9, 1999.

(30) Foreign Application Priority Data

Sep. 11, 1998 (JP) .......................................... 10-257742

(51) Int. Cl.$^7$ ....................... H01L 27/108; H01L 29/76; H01L 29/94; H01L 21/20
(52) U.S. Cl. ........................ 257/309; 438/398; 438/255
(58) Field of Search ......................... 257/309, 66, 303, 257/301, 300; 438/398, 479, 532, 253–256

(56) References Cited

U.S. PATENT DOCUMENTS

| 5,989,973 A | 11/1999 | Zahurak et al. ............. 438/398 |
| 6,069,053 A | 5/2000 | Ping et al. .................. 438/398 |

FOREIGN PATENT DOCUMENTS

| JP | 3-234051 | 10/1991 |
| JP | 5-175456 | 7/1993 |
| JP | 6-204426 | 7/1994 |
| JP | 6-244378 | 9/1994 |
| JP | 8-195482 | 7/1996 |
| JP | 8-298312 | 11/1996 |
| JP | 8-306881 | 11/1996 |
| JP | 9-191092 | 7/1997 |
| JP | 9-237877 | 9/1997 |
| JP | 11-204450 | 7/1999 |

Primary Examiner—Matthew Smith
Assistant Examiner—Calvin Lee
(74) Attorney, Agent, or Firm—Sughrue Mion, PLLC

(57) ABSTRACT

A semiconductor memory device includes an interlayer insulating film, a contact film, a crystallization preventing film and a conductive film. The interlayer insulating film is formed on a semiconductor substrate to cover a source/drain region of a MOS transistor. The source/drain region is formed in the semiconductor substrate. The contact film with a first impurity ion concentration contacts the source/drain region. The contact film is formed to partially embed a contact hole along side wall of the contact hole formed to pass through the interlayer insulating film to the source/drain region. The crystallization preventing film with a second impurity ion concentration is formed on the contact film to completely embed the contact hole. The first impurity ion concentration is higher than the second impurity ion concentration. The conductive film with a third impurity ion concentration is formed on a surface of the crystallization preventing film above the interlayer insulating film to have an uneven portion.

9 Claims, 5 Drawing Sheets

DOPING (PH3 ANNEALING, ION IMPLANTATION etc.)

SEMICONDUCTOR DEVICE WITH STACK ELECTRODE FORMED USING HSG GROWTH

This is a divisional application of application Ser. No. 09/392,660 filed Sep. 9, 1999, the disclosure of which is incorporated herein by reference.

BACKGROUND OF THE INVENTION

1. Field of the Invention

The present invention relates to a semiconductor device and a method of manufacturing the same, and more particularly to a semiconductor device with a stack electrode formed using HSG (hemi-spherical grain) growth and a method of manufacturing the same.

2. Description of the Related Art

A technique is known in which small unevenness is formed on the surface of a stack electrode using HSG growth to increase a surface area of the stack electrode, resulting in increase of a memory capacitance. FIGS. 1A to 1C show a conventional method of forming the stack electrode for a memory capacitor using the HSG growth.

First, as shown in FIG. 1A, an oxide film 22 is formed on a silicon substrate 21. A capacitance contact hole is formed to pass through the oxide film 22 to the silicon substrate 21. An amorphous silicon (a-Si) layer containing the impurity ions such as phosphorus ions is grown at the temperature of 500 to 550° C. using a $SiH_4$ gas and a $PH_3$ gas to have the film thickness of 200 to 1000 nm. For example, the amorphous silicon layer is processed to form an amorphous silicon film 24 by use of a photolithography method and an etching method, to meet the shape of the stack electrode section. As a result, the stack electrode section composed of a stack section 20 and a capacitance contact section 23 is formed.

Next, as shown in FIG. 1B irradiation of $SiH_4$ and heat treatment are performed in vacuum at the temperature of 500 to 600° C., so that nuclei 27 for HSG grains 11 are formed only on the surface of a stack electrode. The crystallization progresses from the interface between the capacitance contact section 23 and the oxide film 22 toward the surface of the stack section 20, at the same time as the formation of the HSG grains 11 progresses in the surface of the stack section 20. This is because the growth temperature of the HSG grain 11 is near the crystallization temperature of the amorphous silicon. In this way, crystallization section 25 is formed.

Next, as shown in FIG. 1C, the HSG grains 11 are normally formed on most of the surface of the stack section 20 at this time. However, the crystallization from the interface between the contact section 23 and the oxide film 20 reaches the stack section surface partially, before all the HSG grains 11 are formed. Therefore, no HSG grains 11 are formed at the part 26 where the amorphous silicon is crystallized. The part 26 remains as an HSG grain formation defect section.

The stack electrode containing the HSG grain formation defect section has a smaller surface area, compared with the case where the HSG grains 11 are formed on the whole surface. The electrode surface area becomes small. For this reason, a charge quantity which can be stored in a capacitor decreases so that the charge holding time becomes short in case of a DRAM operation, resulting in a fault bit. Therefore, it is necessary to restrain the defect of the HSG grains due to the crystallization from the interface between the contact section 23 and the oxide film 22.

The crystallization of the amorphous silicon film progresses faster as the phosphorus ion concentration is increased in the amorphous silicon film. Therefore, as one method to prevent the crystallization, it could be considered that the phosphorus ion concentration is decreased in the phosphorus doped amorphous silicon film 24 for the stack electrode. If this method is used, the generation of HSG grain formation defect section due to the crystallization can be effectively restrained. However, there is a problem in this method that the surface area increase through the formation of the HSG grains 11 does not contribute to the increase of the memory capacitance.

In order to sufficiently restrain the crystallization, the concentration of the phosphorus ions in the film must be made equal to or less than $1 \times 10^{20}$ $cm^{-3}$. When an amorphous silicon with phosphorus ions doped in such low concentration is used, the phosphorus ion concentration in the HSG grain decreases. Therefore, when voltage is applied to the memory capacitor, a depletion layer is formed to extend from the HSG grain so that the memory capacitace value decreases, as shown in FIG. 3.

Therefore, when a phosphorus doped amorphous silicon with the low concentration equal to or less than $1 \times 10^{20}$ $cm^{-3}$ is used, it is necessary that impurity ions are doped after the HSG grain formation to increase the phosphorus ion concentration in the HSG grain. Thus, the formation of the depletion layer because of HSG grains with low impurity ion concentration can be restrained. However, it is difficult to externally dope impurity ions into the inside of the stack electrode. In this case, because the phosphorus ion concentration in the amorphous silicon remains low, the contact resistance between the stack electrode and the substrate becomes high.

In conjunction with the above, in Japanese Laid Open Patent Application (JP-A-Heisei 6-204426) is described a method of forming a storage node electrode in a stacked type DRAM. In this reference, a contact hole is filled with a doped amorphous silicon and an undoped amorphous silicon is formed only on a stacked electrode. Therefore, a crystallization would progress in a heat treatment.

Also, in Japanese Laid Open Patent Application (JP-A-Heisei 9-237877) is described a semiconductor device. In this reference, a polysilicon film is formed on a substrate, and a doped amorphous silicon is formed on the polysilicon film.

Also, in Japanese Laid Open Patent Application (JP-A-Heisei 9-191092) is described a method of manufacturing a capacitor of a semiconductor device using a polysilicon film. In this reference, an HSG film is used for an electrode. However, the contact hole is not filled with films with different concentrations.

SUMMARY OF THE INVENTION

Therefore, an object of the present invention is to provide a semiconductor memory device with a stack electrode in which any defect due to crystallization can be restrained with a low contact resistance and generation of a depletion layer from an HSG grain can be prevented.

Another object of the present invention is to provide a method of manufacturing the above semiconductor memory device.

In order to achieve an aspect of the present invention, a semiconductor memory device includes a source/drain region of a MOS transistor, an interlayer insulating film and a stack electrode section. The source/drain region is formed in a semiconductor substrate. The interlayer insulating film is formed on the semiconductor substrate to cover the source/drain region. The stack electrode section is formed to pass through the interlayer insulating film to the source/drain region, and includes a contact section embedded in the interlayer insulating film and a stack section above the interlayer insulating film, the stack section having an uneven surface portion. An impurity ion concentration of the surface portion of the stack section is higher than that of an inside of the contact section.

An impurity ion concentration of a contact portion contacting the source/drain region of the contact section and the impurity ion concentration of the surface portion of the stack section are higher than that of the inside of the contact section. Also, the impurity ion concentration of the surface portion of the stack section is higher than that of the inside of the contact section and that of the contact portion of the contact section.

Also, the uneven surface portion includes hemi-sphere gains. In this case, the uneven surface portion is connected to a contact portion contacting the source/drain region of the contact section through a portion whose impurity ion concentration is higher than that of the other portion of the stack electrode section. Also, impurity of the surface portion is phosphorus ions or arsenic ions.

In order to achieve another aspect of the present invention, a method of manufacturing a semiconductor memory device includes:

forming an interlayer insulating film on a semiconductor substrate to cover a source/drain region of a MOS transistor, the source/drain region being formed in the semiconductor substrate;

opening a contact hole to pass through the interlayer insulating film to the source/drain region;

forming a silicon layer with a first impurity ion concentration to partially embed the contact hole along a side wall of the contact hole;

forming a doped amorphous silicon layer with a second impurity ion concentration on the silicon layer to embed the contact hole, the second impurity ion concentration being lower than the first impurity ion concentration;

patterning the silicon layer and the doped amorphous silicon layer to produce a stack section above the interlayer insulating film, a stack electrode section including the stack section and a contact section for the contact hole;

performing heat treatment to form silicon hemi-sphere grains on a surface portion of the stack section; and externally doping impurity ions into the surface portion of the stack section to have a third impurity ion concentration.

The third impurity ion concentration is higher than the second impurity ion concentration. Also, the third impurity ion concentration is higher than the first impurity ion concentration. The first impurity ion concentration is equal to or more than $1 \times 10^{20}$ cm$^{-3}$.

The step of forming a silicon layer may include forming an amorphous silicon layer. In this case, the amorphous silicon layer preferably has the second impurity ion concentration equal to or less than $7 \times 10^{19}$ cm$^{-3}$. Otherwise, the amorphous silicon layer may be an undoped amorphous silicon layer.

Also, the step of forming a silicon layer may include forming a polysilicon layer.

The step of forming a silicon layer may include forming the silicon layer to have a film thickness of 50 to 150 nm, and the step of forming a doped amorphous silicon layer may include forming the doped amorphous silicon layer to have a film thickness of 200 to 1000 nm.

In addition, the step of performing heat treatment may include performing the heat treatment in a vacuum condition while SiH$_4$ is irradiated.

Moreover, the surface portion of the stack section is preferably connected to the source/drain region though the silicon layer.

In order to achieve still another aspect of the present invention, a semiconductor memory device includes an interlayer insulating film, a contact film with a first impurity ion concentration, a crystallization preventing film with a second impurity ion concentration and a conductive film with a third impurity ion concentration. The interlayer insulating film is formed on a semiconductor substrate to cover a source/drain region of a MOS transistor. The source/drain region is formed in the semiconductor substrate. The contact film contacts the source/drain region and is formed to partially embed a contact hole along a side wall of the contact hole formed to pass through the interlayer insulating film to the source/drain region. The crystallization preventing film is formed on the contact film to embed the contact hole. The first impurity ion concentration is higher than the second impurity ion concentration. The conductive film is formed on a surface of the crystallization preventing film above the interlayer insulating film to have an uneven portion.

Here, the third impurity ion concentration is preferably higher than the second impurity ion concentration. Also, the third impurity ion concentration is preferably higher than the first impurity ion concentration. In this case, the first impurity ion concentration is equal to or more than $1 \times 10^{20}$ cm$^{-3}$.

The contact film includes either an undoped amorphous silicon film, a less doped amorphous silicon film, or a polysilicon film. Also, the crystallization preventing film includes a doped amorphous silicon film.

Also, the contact film has a film thickness of 50 to 150 nm, and the crystallization preventing film has a film thickness of 200 to 1000 nm.

In addition, the conductive film includes hemi-sphere gains of silicon.

DETAILED DESCRIPTION OF THE PREFERRED EMBODIMENTS

Next, the semiconductor memory device of the present invention will be described below in detail with reference to the attached drawings.

Figure 1A:
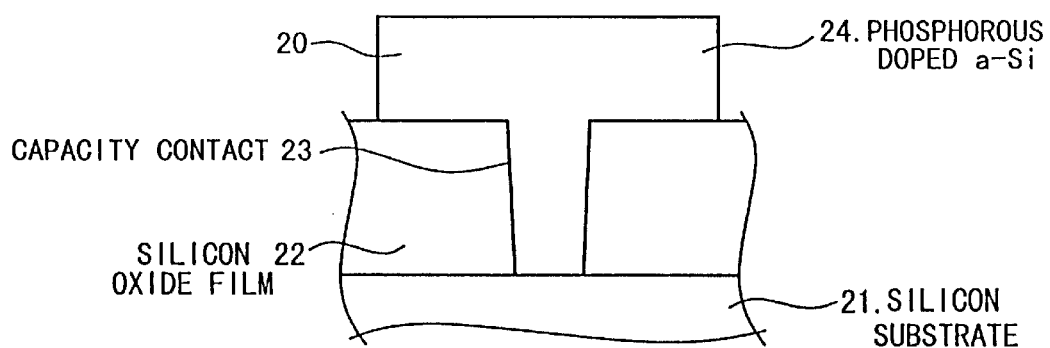
FIGS. 1A to 1C show cross sectional views of a semiconductor memory device with a stack electrode manufactured by a conventional method.
Figure 1B:
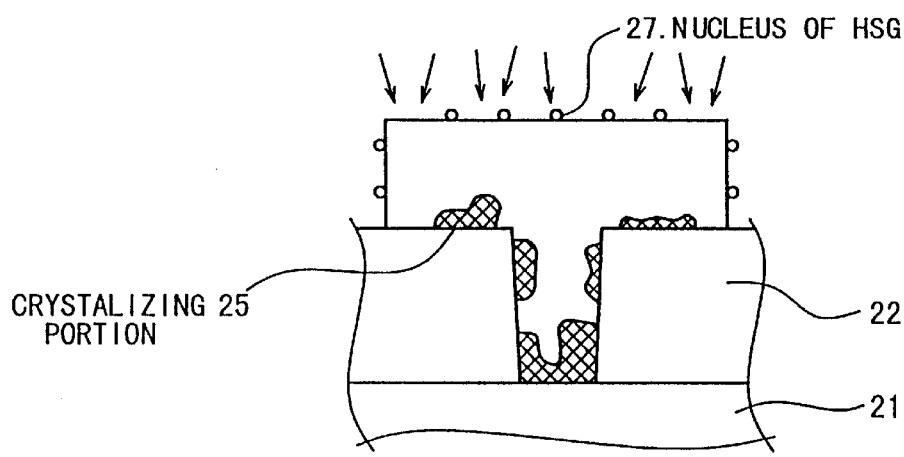
Figure 1C:
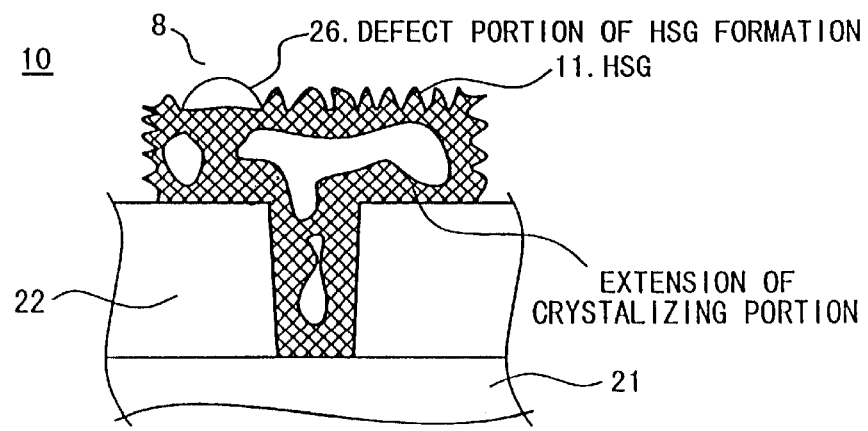
Figure 2A:
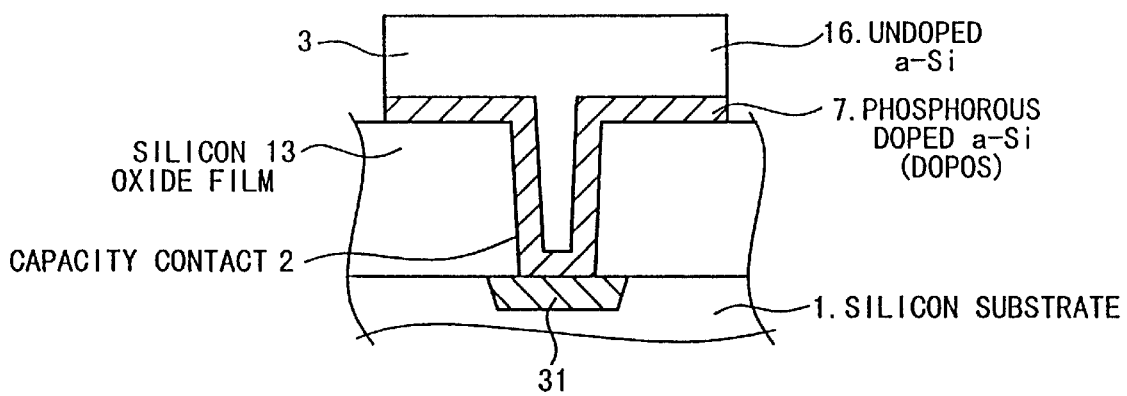
FIGS. 2A to 2C show cross sectional views of a semiconductor memory device with a stack electrode manufactured by a method according to a first embodiment of the present invention.
Figure 2B:
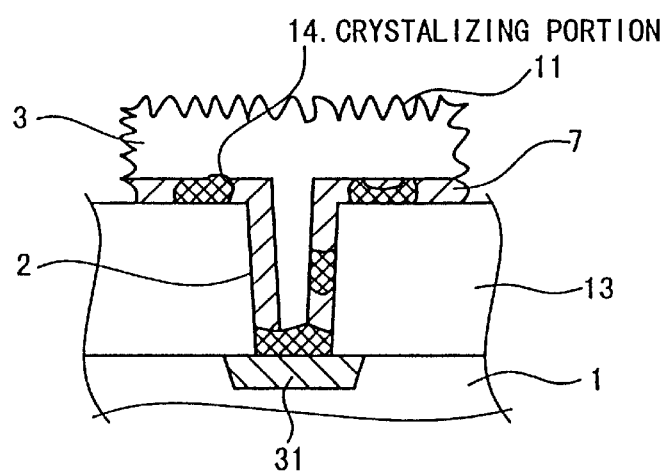
Figure 2C:
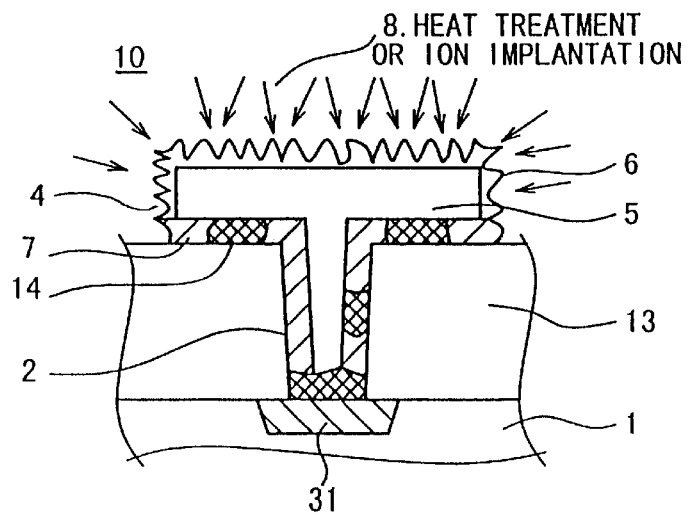
Figure 3:
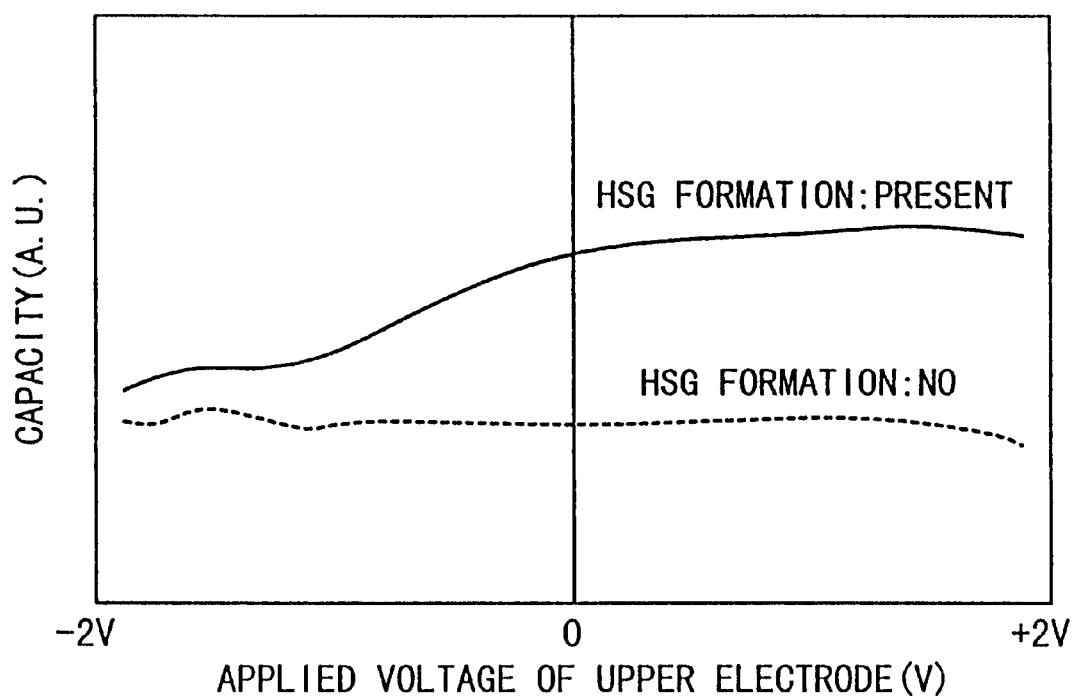
FIG. 3 is a graph indicating comparison between a semiconductor memory device manufactured by the method of the present invention and a semiconductor memory device by the conventional method in capacitance.

Referring to FIG. 2C, in the semiconductor memory device of the present invention, a MOS transistor (not shown) having a gate electrode is formed on a silicon substrate 1. The MOS transistor has source/drain regions in the silicon substrate and one of the source/drain regions is shown with a reference numeral of 31 in FIG. 2C. An oxide film 13 as an interlayer insulating film is formed on the silicon substrate 1 to cover the gate electrode and the source/drain region 31. A contact hole is formed to pass through the oxide film 13 to the source/drain region 31.

Subsequently, a phosphorous doped amorphous silicon film 7 is formed to cover inner walls of the contact hole and a surface portion of the oxide film 13. After the formation of the phosphorous doped amorphous silicon film 7, a space remains in the contact hole. An undoped or less doped amorphous silicon film (the undoped amorphous silicon film 16 in this example) is formed to fill the remaining space of the contact hole and to cover a surface portion of the doped amorphous silicon film 7. The phosphorous doped amorphous silicon film 7 and the undoped amorphous silicon film 16 are patterned by use of a usual photolithography method and an etching method. Thus, a stack electrode section comprising a stack section 3 and a contact section 2 is formed.

HSG grains are formed on the surface portion of the stack section 3, i.e., the side wall surfaces of the phosphorous doped amorphous silicon film 7 and the undoped amorphous silicon film 16 and the top surface of the undoped amorphous silicon film 16.

As described above, the semiconductor device 10 of the present invention includes a stack electrode section which comprises the capacitor contact section 2 formed in the oxide film 13 and the stack section 3 connected with the capacitor contact section 2. Small uneven portions 11 are formed on the surface portion of the stack section 3. Also, the impurity ion concentration in the region 6 for the small uneven portions 6 is higher than that in the inside region 5 of the stack section 3 at least. Also, the impurity ion concentration in the amorphous silicon film 7 is higher than that in the inside region 5 of the stack section 3 at least.

Next, a method of manufacturing a semiconductor memory device according to an embodiment of the present invention will be described below in detail with reference to FIGS. 2A to 2C.

As shown in FIG. 2A, element separation films and a gate insulating film (both not shown) are formed on a silicon substrate 1. Subsequently, a gate electrode (not shown) is formed and then source/drain regions are formed by use of an ion implantation method. In this case, side wall insulating films may be formed around the gate electrode. In this way, a MOS transistor is formed as a memory cell transistor by use of the well known method. One of the source/drain regions is shown in FIG. 2A by 31.

Next, an oxide film 13 is formed as an interlayer insulating film on the MOS transistor and the silicon substrate 1. Subsequently, a capacitor contact hole is formed to pass through the oxide film 13 to the source/drain region 31. Subsequently, an amorphous silicon (a-Si) film 7 containing phosphorous ions is grown using a $SiH_4$ gas and a $PH_3$ gas to have the film thickness of 50 to 150 nm. The amorphous silicon (a-Si) film 7 covers the inner walls of the capacitor contact hole and the surface of the oxide film 13. In this case, a space remains in the capacitor contact hole.

The concentration of the phosphorus ions in the amorphous silicon film 7 is equal to or more than $1\times10^{20}$ cm$^{-3}$. Thus, the amorphous silicon (a-Si) film 7 has a high impurity ion concentration. Subsequently, an undoped amorphous silicon film 16 is filled in the remained space of the capacitor contact 2. At the same time, the undoped amorphous silicon film 16 is formed on the amorphous silicon (a-Si) film 7 to have the film thickness of 200 to 1000 nm. Subsequently, the undoped amorphous silicon film 16 and the amorphous silicon (a-Si) film 7 are patterned by use of the usual photolithography method and etching method.

In the above example, the film 16 is undoped. However, the film 16 may contain less impurity ions. For example, the concentration of the phosphorus or arsenic ions as the impurity ions may be equal to or less than $7\times10^{19}$ cm$^{-3}$. In this case, the less doped film 16 is formed at the temperature of 500 to 550° C. using $SiH_4$ gas. Also, a polysilicon layer with impurity ions doped is formed in place of the amorphous silicon film 7. However, the amorphous silicon film 7 is superior in film continuation, because the film 16 is amorphous.

Next, as shown in FIG. 2B, heat treatment is carried out in the vacuum at the temperature of 500 to 600° C. while $SiH_4$ are irradiated. As a result, uneven portions, i.e., HSG grains having a mushroom shape are formed on the surface portion of the stack section 3 and the side wall surface thereof above the oxide film 13.

At this time, crystallization 14 progresses from the interface between the oxide film 13 and the capacitor contact section 2 toward the surface portion of the stack section 3. At the same time, the HSG grains 11 are formed on the side wall surface and top surface of the stack section 3. However, because the phosphorus ion concentration is low in the amorphous silicon film 16, the crystallization stops inside the amorphous silicon film 7. Thus, the crystallization does not reach the side wall surface and top surface of the stack section 3.

Next, as show in FIG. 2C, phosphorus or arsenic ions are externally doped into the HSG grains 11. As the method of doping the phosphorus or arsenic ions, there are phosphorus ion diffusion using $POCl_3$ at the temperature of 700 to 750° C., heat treatment in the gas containing dopant such as $PH_3$ and $AsH_3$ at the temperature of 650 to 750° C., and ion implantation of P and As.

Through this doping, the peripheral portion 4 of the stack section 3 becomes low in resistance, so that the peripheral portion 4 of the stack section 3 is electrically connected with the amorphous silicon film 7. Also, enough phosphorous or arsenic ions are introduced in the HSG grains 11. As a result, the decrease of the memory capacitance due to the depletion layer extending from the HSG grains can be prevented. In this case, the doped impurity ions may be introduced into the inside 5 of the stack section 3.

As the result of the above processes,
① because the amorphous silicon layer 7 contains the high concentration of phosphorus ions, the contact resistance between the contact section 2 and the source/drain region 31 is low,
② because the phosphorus or arsenic ion concentration is low in the amorphous silicon layer 16, the crystallization is slow during the HSG growth and the HSG crystallization defect section is difficult to be generated, and
③ because impurity ions are externally doped after the HSG gain formation, enough dopants are introduced into the HSG grains so that the formation of the depletion layer from the HSG grain can be restrained and a portion of the HSG grains can be electrically connected with the amorphous silicon film 7.

In this way, the doped amorphous silicon film 7 functions as a contact film, the undoped amorphous silicon film 16 functions as a crystallization preventing film. Also, the HSG gain layer 6 functions as a conductive layer.

Next, the semiconductor memory device according to the second embodiment of the present invention will be described below in detail with reference to the drawings FIGS. 4A to 4C.

Figure 4A:
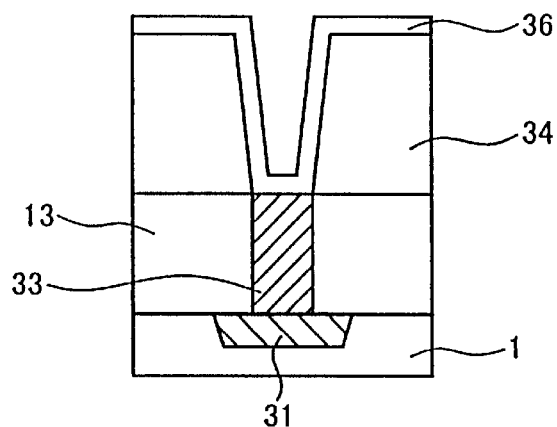
FIGS. 4A to 4C are cross sectional views of the semiconductor memory device with a stack electrode manufactured by a method according to a second embodiment of the present invention.

Referring to FIG. 4A, in the semiconductor memory device of the present invention, a MOS transistor (not shown) having a gate electrode is formed on a silicon substrate 1. The MOS transistor has source/drain regions 31 in the silicon substrate. An oxide film 13 as an interlayer insulating film is formed on the silicon substrate 1 to cover the gate electrode and the source/drain region 31. A contact hole is formed to pass through the oxide film 13 to the source/drain region 31.

Subsequently, the contact hole is buried with a phosphorous doped amorphous silicon film or a polysilicon film to form a contact plug 33. Then, an interlayer oxide film 34 is formed on the contact plug 33 and the oxide film 13 to have the film thickness of 200 to 1000 nm. A contact hole is formed to pass through the interlayer-oxide film 34 to the contact plug 33, and a second amorphous silicon layer is formed to cover the surface of the interlayer oxide film 34 and the inner surface of the formed contact hole. The phosphorus concentration of the amorphous silicon 36 is at least less than that of the contact plug 33, and more preferably, is undoped. The film thickness of the amorphous silicon 36 is as small as 50 to 100 nm so that the contact hole is not completely buried.

Figure 4B:
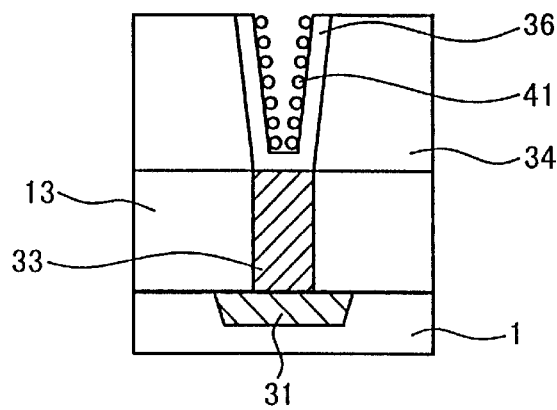

Next, as shown in FIG. 4B, the amorphous-silicon layer on the top of the interlayer oxide film 34 is removed so that an amorphous silicon film 36 is obtained. Then, HSG grains are formed by annealing in the vacuum at temperature of 500 to 600° C. while $SiH_4$ are irradiated. As a result, uneven portions, i.e., HSG grains having a mushroom shape are formed on the amorphous-10 silicon film 36.

Figure 4C:
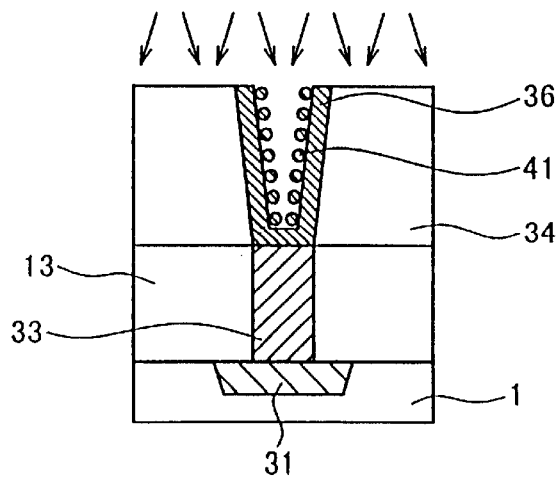

Next, as shown in FIG. 4C, phosphorus or arsenic ions are externally doped into the HSG grains. As the method of doping the phosphorus or arsenic ions, there are phosphorus ion diffusion using $POCl_3$ at the temperature of 700 to 750° C., heat treatment in the gas containing dopant such as $PH_3$ and $ASH_3$ at the temperature of 650 to 750° C., and ion implantation of P and As.

Through this doping, HSG grains are doped with large concentration of phosphorus or arsenic. Furthermore, because the film thickness of the amorphous silicon film 36 is small, the phosphorus or arsenic ions penetrate through the amorphous silicon film 36 and reach the contact plug 33. As a result, the amorphous silicon film 36 is electrically connected to the contact plug 33 and also to the source/drain.

As described above, the dopant concentration of the amorphous silicon film 36 at the HSG grain formation is small, so that crystallization defects during HSG formation will not occur.

Figure 5A:
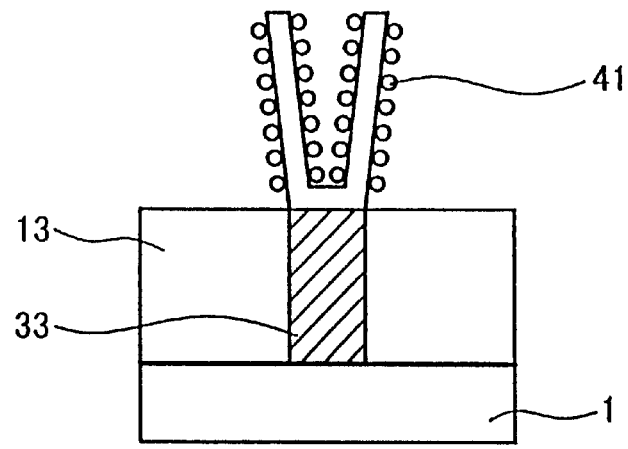
FIGS. 5A and 5B are modification examples of the semiconductor memory device manufactured by the method according to the second embodiment of the present invention.
Figure 5B:
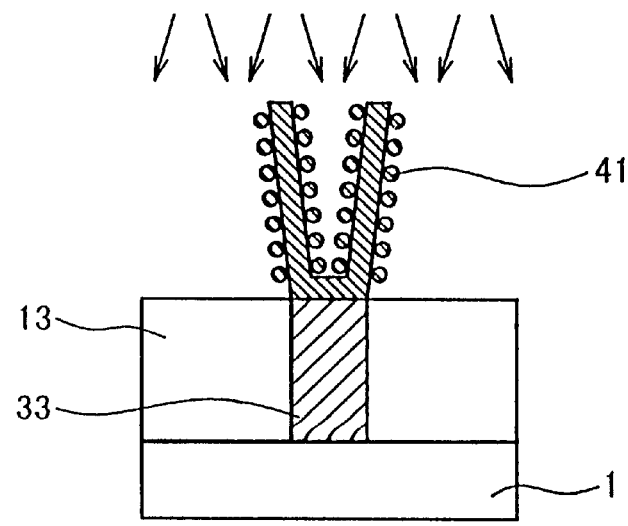

The interlayer oxide film 34 may be removed before the HSG formation. In this case, as shown in FIG. 5A, the HSG grains are formed both on the outer- and inner-surface of the amorphous silicon film 36. Subsequently, as shown in FIG. 5B, phosphorus or arsenic ions are externally doped into the HSG grains.

What is claimed is:

1. A semiconductor memory device comprising:
   a source/drain region of a MOS transistor, said source/drain region being formed in a semiconductor substrate;
   an interlayer insulating film formed on said semiconductor substrate to cover said source/drain region; and
   a stack electrode section formed to pass through said interlayer insulating film to said source/drain region, and including a contact section embedded in said interlayer insulating film and a stack section above said interlayer insulating film, said stack section having an uneven surface portion,
   wherein an impurity ion concentration of said surface section of said stack section is higher than that of an interior portion of said stack section.

2. A semiconductor memory device according to claim 1, wherein an impurity ion concentration of a contact portion contacting said source/drain region of said contact section and said impurity ion concentration of said surface portion of said stack section are higher than that of said inside of said contact section.

3. A semiconductor memory device according to claim 1, wherein said impurity ion concentration of said surface portion of said stack section is higher than that of said inside of said contact section and that of said contact portion of said contact section.

4. A semiconductor memory device according to claim 1, wherein said uneven surface portion includes hemi-sphere gains.

5. A semiconductor memory device according to claim 4, wherein said uneven surface portion is connected to a contact portion contacting said source/drain region of said contact section through a portion whose impurity ion concentration is higher than that of the other portion of said stack electrode section.

6. A semiconductor memory device according to claim 4, wherein impurity of said surface portion is phosphorus ions or arsenic ions.

7. A semiconductor device having an electrode comprising:
   a contact section formed in an interlayer insulating film which is provided on a semiconductor substrate; and
   a stack section connected with said contact section, and
   wherein said stack section has a surface region in which an HSG layer is formed, and
   an impurity concentration of said surface region is higher than that of an interior portion of said stack section.

8. A semiconductor device having an electrode comprising:
   a contact section formed in an interlayer insulating film which is provided on a semiconductor substrate; and
   a stack section with a surface region connected with said contact section, and
   wherein said stack section has a surface region in which an HSG layer is formed, and
   an impurity concentration of said contact surface region and said stack section surface region is higher than that of an interior portion of said stack section and an interior portion of said contact section.

9. A semiconductor device having an electrode comprising:
   a contact section formed in an interlayer insulating film which is provided on a semiconductor substrate; and
   a stack section connected with said contact section, and
   wherein said stack section has a surface region in which an HSG layer is formed, and
   an impurity concentration of said stack section surface region is higher than that of an interior portion of said stack section and an interior portion of said contact section.

* * * * *